United States Patent [19]

Lewis

[11] Patent Number: 4,710,649

[45] Date of Patent: Dec. 1, 1987

[54] TRANSMISSION-GATE STRUCTURED LOGIC CIRCUITS

[75] Inventor: Edward T. Lewis, Sudbury, Mass.

[73] Assignee: Raytheon Company, Lexington, Mass.

[21] Appl. No.: 850,642

[22] Filed: Apr. 11, 1986

[51] Int. Cl.$^4$ .......................................... H03K 19/094
[52] U.S. Cl. ................................... 307/451; 307/448; 307/585
[58] Field of Search ............... 307/443, 448, 451, 577, 307/579, 584, 585

[56] References Cited

U.S. PATENT DOCUMENTS

| | | | |
|---|---|---|---|
| 3,356,858 | 12/1967 | Wanlass | 307/451 |
| 3,457,435 | 7/1969 | Burns et al. | 307/585 |
| 3,769,523 | 10/1973 | Suzuki | 307/451 |
| 3,986,042 | 10/1976 | Padgett | 307/446 |
| 4,006,365 | 2/1977 | Marzin et al. | 307/205 |
| 4,233,524 | 11/1980 | Burdick | 307/205 |
| 4,417,161 | 11/1983 | Uya | 307/471 |
| 4,453,096 | 6/1984 | Le Can et al. | 307/468 X |
| 4,558,236 | 12/1985 | Burrows | 307/448 X |
| 4,575,648 | 3/1986 | Lee | 307/471 |
| 4,620,117 | 10/1986 | Fang | 307/451 |
| 4,652,773 | 3/1987 | Cartwright, Jr. | 307/451 X |

FOREIGN PATENT DOCUMENTS

| | | | |
|---|---|---|---|
| 0094234 | 11/1983 | European Pat. Off. | 307/448 |
| 109427 | 7/1980 | Japan | 307/451 |
| 61829 | 5/1981 | Japan | 307/448 |
| 126326 | 10/1981 | Japan | 307/451 |
| 57-57033 | 4/1982 | Japan | 307/451 |
| 34629 | 3/1983 | Japan | 307/451 |

OTHER PUBLICATIONS

Taub and Schilling, Digital Integrated Electronics, pub. by McGraw-Hill, Inc. USA, 1977, p. 93.
Hiltebeitel, "Two-Device CMOS Logic Functions"; IBM-TDB; vol. 27, No. 6, pp. 3346; 11/1984.
Rapp, "Complementary FET Logic Gate"; RCA Technical Notes; TN No.: 676, 6/1966.
Majos et al., "Multi-MOS Structure Speeds Layout of VLSI Chips"; Electronics (pub.), pp. 111-113; 11/17/1981.
High-Speed CMOS Logic Data Book, Texas Instruments, 1984, p. 7-4.
Introduction to nMOS and CMOS VLSI Systems Design by Amar Mukherjee, Prentice-Hall, 1986, Chapters 2 and 3.
Cascading Transmission Gates to Enhance Multiplier Performance by R. R. Shively et al., IEEE Transactions on Computers, vol. C-33, No. 7, Jul. 1984.

Primary Examiner—Stanley D. Miller
Assistant Examiner—D. R. Hudspeth
Attorney, Agent, or Firm—Walter F. Dawson; Richard M. Sharkansky

[57] ABSTRACT

Unified CMOS logic circuits are based on a structured implementation of transmission-gates. The basic logic building blocks for AND and OR circuits comprise a plurality of transmission-gates some of which may be simplified to a reduced form of a single pass transistor resulting in fewer transistors for implementing logic functions without loss of logic circuit performance characteristics. Three variable logic functions and higher order logic functions are easily implemented. Generally, the required VLSI chip area is minimized as a result of this structured transmission-gate approach.

9 Claims, 16 Drawing Figures

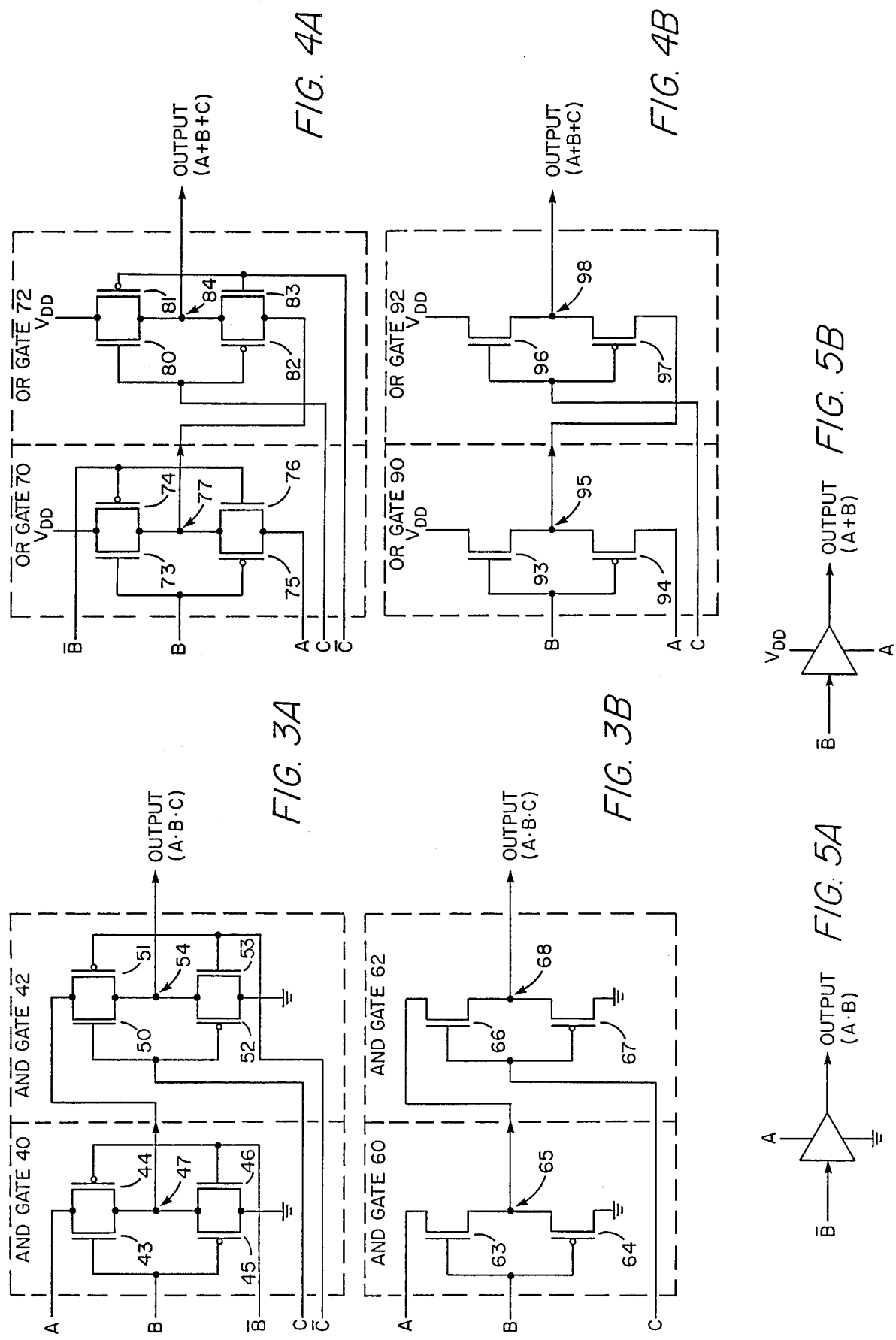

TRANSMISSION-GATE STRUCTURED LOGIC CIRCUITS

BACKGROUND OF THE INVENTION

This invention relates generally to logic circuits and more particularly to logic circuits adapted for very large scale integrated (VLSI) circuit layouts.

As is known in the art, CMOS (complementary metal oxide semiconductor) transmission-gate based logic circuits have been used as efficient solutions for generating specific logic functions. Such CMOS transmission-gate circuits typically includes a P-channel and an N-channel MOS transistor having gates fed by a complementary logic signal. The source electrodes are connected together to form a common input fed by a second logic signal and the drains are connected together to form a common output. Thus, when the first logic signal is at a first logic state, the second logic signal is coupled through the gate and appears at the output, and conversely, when the first logic signal is at a second, complementary logic state, the second logic signal is inhibited (i.e. decoupled) from passing to the output. One logic function implemented with such CMOS transmission-gates is an Exclusive-OR gate such as is shown in the High-Speed CMOS Logic Data Book published by Texas Instruments, 1984 on page 7-4. Here, a pair of CMOS transmission-gates are provided with the outputs thereof connected in common to provide the output for the Exclusive-OR gate. The true and complement of the second logic signal are fed to the input of a corresponding one of the transmission-gates. The true and complement of the first logic signal are fed to the transmission-gates such that when the first logic signal is in a first logic state (say true), the complement of the second logic signal passes through one of the transmission-gates to the output of the Exclusive-OR gate and conversely, when the first logic signal is in the second state (i.e. complement), the true of the second logic signal passes the other one of the transmission-gates to the output of the Exclusive-OR qate. A further "ad hoc" simplification of a CMOS Exclusive-OR gate is shown and described in U.S. Pat. No. 4,417,161 to Masaru Uya and assigned to Matsushita Electric Industrial Co., Ltd. Thus, CMOS transmission-gates have been shown to minimize area and delay when implemented on a CMOS based VLSI chip. However, there does not appear to be a uniform approach to the creation of these special circuit solutions. For example, Boolean functions (i.e. OR, AND, NOR and NAND) are typically realized using conventional state CMOS logic technology by combining ordered arrangements of NAND and NOR gates.

A conventional CMOS NOR gate typically includes a plurality of N-channel MOS transistors, one for each input to the gate and a like plurality of P-channel MOS transistors. The sources-drains of the N-channel transistors are coupled in shunt between ground and the output; each gate is fed by a corresponding logic signal. The sources-drains of the P-channel transistors are serially connected between $+V_{DD}$ and the output; each gate also being fed by a corresponding one of the logic signals. Hence, if any one of the logic signals is "high", the N-channel transistor fed by such signal conducts bringing the output towards ground. However, if all logic signals are "low", the N-channel devices are nonconducting and the P-channel devices turn on pulling the output up to $+V_{DD}$. Thus, the series connection of the P-transistors result in a long delay time when responding to all "high" input signals unless their W/L ratios are increased in proportion to the number of serial transistors. In fact, when the serial chain exceeds five, distribution effects are similar to an R-C delay line.

For the NAND gate, a similar, yet complementary, effect exists. In this case, the N-channel transistors are serially coupled between the output and ground; each one having its gate coupled to a corresponding one of the input signals. The P-channel transistors are coupled in parallel between $+V_{DD}$ and the output; each one having its gate coupled to a corresponding one of the inputs. Thus, if any one of the inputs is "low", the P-channel transistors fed by it conducts and the output is at $+V_{DD}$; however, when all of the inputs go "high", all of the N-channel transistors go towards conduction driving the output towards ground. Thus, in this case, the W/L ratios of the N-channel transistors must be increased in proportion to the number of those in series. Further, with the NOR gate, since the carrier (hole) mobility of the P-channel transistors is lower than that of the carrier (electron) mobility of the N-channel transistor, the W/L ratio of the P-channel transistor must be typically larger than that of the N-channel transistor in order to obtain balanced dynamic performance. This, however, results in a very large area consumption for multi-input NOR gates in order to preserve logic "1" output speed. In order to overcome these problems, a number of other circuit forms have been developed. Among these are pre-charge logic, programmable logic arrays, domino-logic, etc. These are typically "dynamic" in form and impose additional constraints on system timing (as well as logic structuring).

SUMMARY OF THE INVENTION

In accordance with the present invention, a logic circuit is provided for providing an output logic signal at an output port having a logic state representative of a predetermined combination of the logic states of a pair of input logic signals, such circuit comprising: means, responsive to a first one of the pair of logic signals, for coupling either a second one of the pair of input logic signals to the output port while decoupling from the output port a signal having a predetermined fixed potential representative of one of the logic states of the output signal in response to a first logic state of the first one of the pair of input logic signals, or, alternatively, coupling the fixed potential signal to the output port while decoupling the second one of the pair of input logic signals from the output port in response to a second logic state of the first one of the pair of input logic signals.

In a preferred embodiment, the coupling means includes an n-channel MOS transistor and a p-channel MOS transistor, such transistors having sources and drains serially coupled between a source of the second inout logic signal and the source of the fixed potential signal at the output port. The gate of the transistors are fed by the first input logic signal. The predetermined fixed reference potential is either ground or $+V_{DD}$. Thus, with such an arrangement, this structure may be configured as a static OR or AND gate by the simple interchange of the reference potential, ground and one input logic signal and requiring no dynamic precharge operation. Further, since it is CMOS, it consumes nanowatt static power. Further, it is modular and flexible, adapting itself to simple, yet efficient VLSI layouts. It can be configured to optimize area and speed for many higher order combinational logic functions and can be simply extended to create logic derivatives in a very structured format.

In accordance with the present invention, a plurality of input logic signals may be converted into an output logic signal representative of a predetermined logical combination of the plurality of input logic signals by replicating a basic 2-input AND gate or a 2-input OR gate in a cascaded manner wherein an output from one cascaded stage is coupled to an input of the next cascaded stage, and a first one and a second one of the input logic signals is fed to a first one of the plurality of cascaded stages and each successive one of the plurality of cascaded stages is fed by an output logic signal from a preceeding stage and another one of the input logic signals. Each of the cascaded stages comprises a pair of electronic switch means, each switch means having an input terminal, a control terminal and an output terminal for coupling or decoupling the input terminal on the output terminal selectively in accordance with the logic state of a signal fed to the control terminal. The first one of the plurality of input logic signals is fed to the input terminal of a first one of the pair of switch means; the second one of the plurality of input signals is fed to the control terminals of the pair of switch means; the first and second electronic switch means of a last stage have the output terminals thereof connected to an output of the logic circuit; and the input of the second electronic switch means in each stage is coupled to a signal having a predetermined reference potential representative of one of the logic states of the input logic signals. The electronic switch means comprises a CMOS transmission-gate.

A further feature of the invention includes a method of converting with a logic circuit a plurality of input logic signals into an output logic signal representative of a predetermined logical combination of the plurality of input logic signals comprising the steps of providing a pair of electronic switch means, each one thereof having an input terminal, a control terminal and an output terminal, coupling or decoupling the input terminal and the output terminal selectively of each of said electronic switch means in accordance with the logic state of a signal fed to the control terminal, feeding a first one of the plurality of input logic signals to the input terminal of a first one of the pair of switch means, feeding a second one of the plurality of input signals to the control terminals of the pair of switch means, connecting the output terminals of such first and second electronic switch means to an output of the logic circuit, and coupling the input of the second electronic switch means to a signal having a predetermined reference potential represenatative of one of the logic states of the input logic signal.

BRIEF DESCRIPTION OF THE DRAWINGS

Other and further features and advantages of the invention will become apparent in connection with the accompanying drawings wherein:

FIGS. 3A and 3B show cascaded AND gates of the invention and a reduced circuit form based on FIGS. 1A and 1D, respectively, for performing a logical AND function on three input signals.

FIGS. 4A and 4B show cascaded OR gates of the invention and a reduced circuit form based on FIGS. 2A and 2D, respectively, for performing a logical OR function on three input signals.

FIGS. 5A and 5B show the logic symbols for embodiments of the invention shown in FIGS. 1C and 2C, respectively.

DESCRIPTION OF THE PREFERRED EMBODIMENTS

Figure 1A:
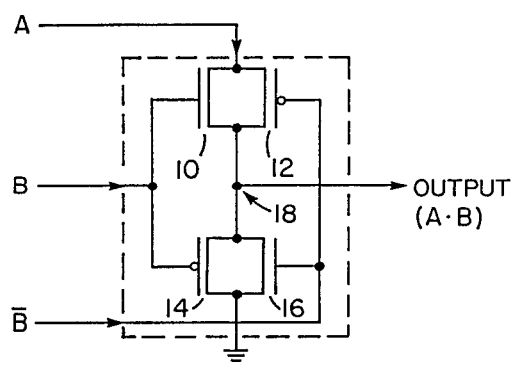
FIGS. 1A and 1B are circuit diagrams of the invention showing structured CMOS transmission-gates for performing an AND logic function.

Referring now to FIGS. 1A TO 1D, four embodiments of an AND gate are shown. Thus, in FIG. 1A four MOS transistors 10, 12, 14 and 16 are interconnected as shown, transistors 10 and 16 being N-channel enhancement mode MOS transistors and transistors 12 and 14 being P-channel enhancement mode MOS transistors. The gates of transistors 10, 14 are fed by a B logic signal. An A logic signal is fed to the drains of transistors 10 and 12. The sources of transistors 14 and 16 are at ground potential. The complement of the B logic signal, i.e. $\overline{B}$ is fed to the gates of transistors 12 and 16. The sources of transistor 10, 12 and the drains of transistors 14, 16 are connected to output 18 port. Thus, if the B logic signal is "high", i.e. logic 1, transistors 10 and 12 are driven to conduction while transistors 14 and 16 are driven to non-conduction with the result that the A logic signal is coupled to output port 18 while electrically decoupling the ground potential from the output port 18. Therefore, the output signal at the output 18 will be a logic 1 if the A logic signal is a logic "1" and the output signal of the output 18 will be a logic "0" if the A logic signal is a logic "0". Further, if the B logic signal is "low" (i.e. logic 0), transistors 14 and 16 are driven to conduction while transistors 10 and 12 are driven to non-conduction with the result that the A logic signal is electrically decoupled from output 18 and the fixed reference potential, here ground, is coupled to output 18. Consequently, under such condition, the output signal at output 18 is a "low" (i.e. ground) logic 0 signal. The operation of the logic AND gate in FIG. 1A may thus be summarized by the following truth table:

TABLE 1

| Logic Signal | | Output Signal |
|---|---|---|
| A | B | Output |
| 0 | 0 | 0 |
| 0 | 1 | 0 |
| 1 | 0 | 0 |
| 1 | 1 | 1 |

Figure 1B:
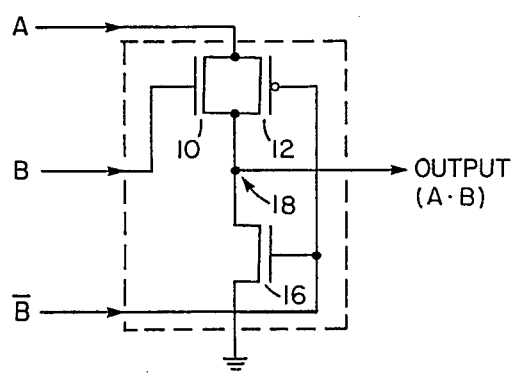
Figure 1C:
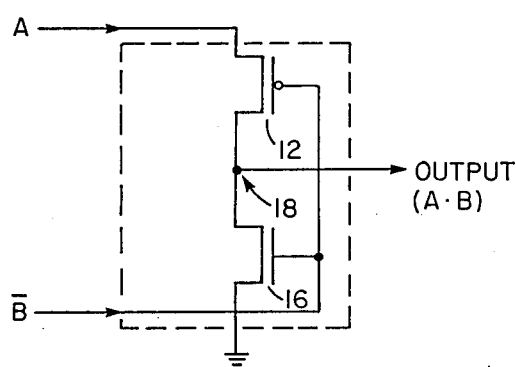
FIGS. 1C and 1D show reduced circuit embodiments of the invention for performing an AND logic function based on structured CMOS transmission-gates.
Figure 1D:
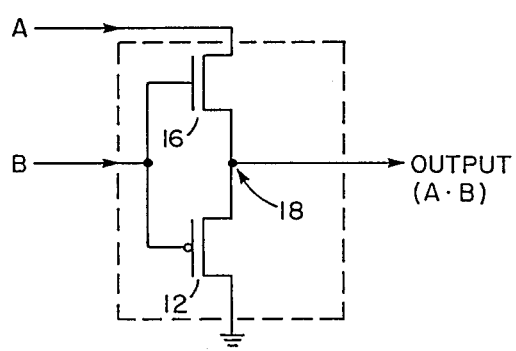

Referring now to FIG. 1B there is shown an embodiment of the invention wherein the P-channel MOS transistor 14 has been removed from the circuit shown in FIG. 1A resulting in a three transistor circuit that performs the AND gate logic function shown in Table 1. Similarly, FIG. 1C shows another embodiment which is a further simplification of FIG. 1A by the additional removal of N-channel MOS transistor 10 resulting in a two transistor circuit that performs the same AND gate function shown in Table 1. For example, when the A logic signal is A logic 1 and the $\overline{B}$ is asserted or at a logic 0 (hence B is a logic 1) then transistor 16 will be OFF and transistor 12 will be switched ON, thereby coupling the A logic signal level 1 to the output 18. When the A logic signal is a logic 0 and $\overline{B}$ is a logic 0 (and B=1), then transistor 16 is OFF and transistor 12 is switched ON, thereby coupling the A logic signal level 0 to the output 18. When $\overline{B}$ logic signal is a logic 1 (B=0), and the A logic signal is either 0 or 1, then transistor 12 is OFF and transistor 16 is switched ON and the output 18 is at logic 0 as a result of the ground reference being coupled through transistor 16 to the output 18. In FIG. 1D the P-channel and the N-channel MOS transistors have been interchanged with respect to the ground reference in the embodiment of FIG. 1C and it also performs the AND gate logic function. Here the A logic signal is fed to the drain of transistor 16 and the B logic signal is fed to the gates of transistors 12 and 16. The source of transistor 12 is at ground potential. The source of transistor 16 and the drain of transistor 12 are connected to output 18. The embodiments shown in FIGS. 1C and 1D may result in some sacrifice of both noise immunity and soeed, but such limitations do not outweigh the advantages of reduced transistors for implementing various logic functions. FIG. 5A shows a logic symbol equivalent for the circuit in FIG. 1C.

Figure 2A:
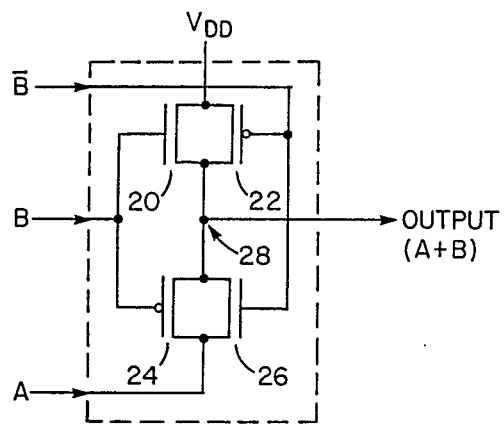
FIGS. 2A and 2B are circuit diagrams of the invention showing structured CMOS transmission-gates for performing an OR logic funtion.

Referring now to FIGS. 2A to 2D, four embodiments of an OR gate are shown. In FIG. 2A four MOS transistors 20, 22, 24, 26 are interconnected as shown, transistors 20 and 26 being N-channel enhancement mode MOS transistors and transistors 22 and 24 being P-channel enhancement mode MOS transistors. The gates of transistors 20 and 24 are fed by a B logic signal. An A logic signal is fed to the sources of transistors 24 and 26. The complement of the B logic signal, $\overline{B}$, is fed to the gates of transistors 22 and 26. The drains of transistors 20 and 22 are connected to a $V_{DD}$ voltage reference. The sources of transistors 20 and 22 and the drains of transistors 24 and 26 are connected to an output 28.

Thus, if logic signal B is 0 (and $\overline{B}$=1) and logic signal A is 0, transistors 20 and 22 will be OFF and transistors 24 and 26 will be switched ON and the A logic signal 0 will be coupled to output 28 thereby providing a logic 0 output. Then if logic signal B becomes a logic 1 while A remains at logic 0, transistors 24 and 26 switch OFF and transistor 20 and 22 switch ON resulting in the $V_{DD}$ reference level being coupled to output 28 providing a logic 1 output. If logic signal A is a logic 1 and logic signal B is a logic 1, then transistors 24 and 26 are OFF and transistors 20 and 22 are ON thereby providing $V_{DD}$ or a logic 1 to output 18. If logic signal A is a logic 1 and logic signal B is a logic 0, then transistors 20 and 22 are OFF and transistors 24 and 26 are switched ON thereby providing the logic signal A logic 1 to output 28. The operation of the logic OR gate in FIG. 2A may thus be summarized by the following truth table:

TABLE 2

| Logic Signal | | Output Signal |
| --- | --- | --- |
| A | B | Output |
| 0 | 0 | 0 |
| 0 | 1 | 1 |
| 1 | 0 | 1 |
| 1 | 1 | 1 |

Figure 2B:
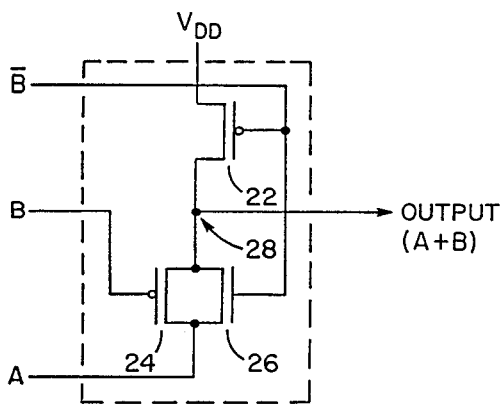
Figure 2C:
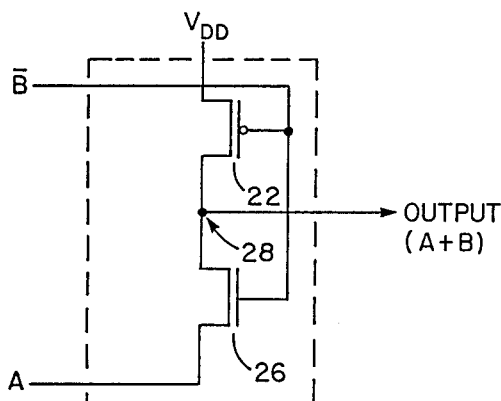
FIGS. 2C and 2D show reduced circuit forms of the invention for performing an OR logic function based on structured CMOS transmission-gates.

Referring now to FIG. 2B there is shown an embodiment of the invention wherein the N-channel MOS transistor 20 has been removed from the circuit resulting in a three transistor circuit that still performs the OR gate logic function shown in Table 2. Similarly FIG. 2C shows another embodiment which is a further simplification of FIG. 1A by the additional removal of P-channel MOS transistor 24 resulting in a two transistor circuit that performs the same AND gate function shown in Table 2. For example, when the A logic signal is 0 and the B logic signal is 0 (hence, $\overline{B}$=1), transistor 22 is OFF and transistor 26 is switched ON and the A logic signal (which is a logic 0) is coupled to the output 28 thereby providing a logic 0 output. If logic signal B becomes a logic 1 ($\overline{B}$=0) and logic signal A remains a logic 0, then transistor 22 is switched ON and transistor 26 is OFF thereby providing the $V_{DD}$ reference or a logic 1 to output 28. If logic signal A is 1 and logic signal B is 1, transistor 22 is ON and transistor 26 is OFF thereby providing the $V_{DD}$ reference or a logic 1 to the output 28. Finally, if logic signal A is 1 and logic signal B is 0 ($\overline{B}$=1), then transistor 22 is OFF and transistor 26 is ON, thereby coupling the logic signal A (which is a logic 1) to the output 28. Again the truth table for an OR gate shown in Table 2 is produced.

Figure 2D:
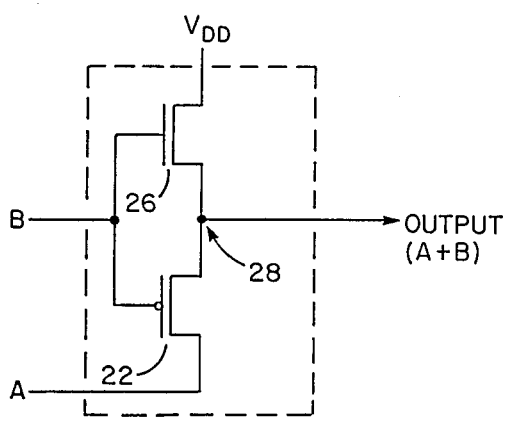

In FIG. 2D the P-channel and N-channel MOS transistors have been interchanged with respect to the $V_{DD}$ reference and the embodiment of FIG. 2C, and this rearranged 2 transistor circuit also performs the OR gate logic function shown in Table 2. Here the B logic signal is fed to the gates of transistors 22 and 26 and the A logic signal is fed to the source of P-channel transistor 22. The source of transistor 26 and the drain of transistor 22 are connected to the output 28 port. The drain of N-channel transistor 26 is connected to the $V_{DD}$ reference. The embodiments shown in FIGS. 2C and 2D may result in some sacrifice of both noise immunity and speed, but as stated previously for the AND gate configuration, such limitations do not outweight the advantages of reduced transistors for implementing logic functions. FIG. 5B shows a logic symbol equivalent for the circuit in FIG. 2C.

Referring now to FIGS. 3A and 3B an embodiment of the invention is shown wherein a replication of the basic 2-input AND gate circuit is employed in a cascaded manner to perform higher order logic functions. A 3 variable AND function is accomplished by the embodiment shown in FIG. 3A and also by the simplified embodiment shown in FIG. 3B. The logic circuit shown in FIG. 3A performs a 3 variable AND gate function and comprises AND gate 40 and AND cate 42. Each of the AND gates 40 and 42 is equivalent to the 2 variable AND gate shown in FIG. 1A and the simplified AND gates 60 and 62 are each equivalent to the simplified AND gates shown in FIG. 1D. The cascaded AND gates 40 and 42 in FIG. 3A and AND gates 60 and 62 in FIG. 3B both perform the AND logic function according to the following truth table:

TABLE 3

| A | B | C | OUTPUT |
|---|---|---|--------|
| 0 | 0 | 0 | 0 |
| 0 | 0 | 1 | 0 |
| 0 | 1 | 0 | 0 |
| 0 | 1 | 1 | 0 |
| 1 | 0 | 1 | 0 |
| 1 | 1 | 0 | 0 |
| 1 | 1 | 1 | 1 |

TABLE 4

| A | B | C | OUTPUT |
|---|---|---|--------|
| 0 | 0 | 0 | 0 |
| 0 | 0 | 1 | 1 |
| 0 | 1 | 0 | 1 |
| 0 | 1 | 1 | 1 |
| 1 | 0 | 1 | 1 |
| 1 | 1 | 0 | 1 |
| 1 | 1 | 1 | 1 |

The circuit in FIG. 3A requires as inputs not only the three logic signals A, B and C but also $\overline{B}$ and $\overline{C}$. Logic signal A is fed to the drains of MOS transistors 43 and 44, logic signal B is fed to the gates of MOS transistors 43 and 45 and the complement, $\overline{B}$, of logic signal B is fed to the gates of MOS transistors 44 and 46. The source of MOS transistors 45 and 46 are coupled to a ground reference. The output 47 of AND GATE 40 which is coupled to the source of MOS transistor 44 and the drain of MOS transistor 46 is fed forward to an input of the next cascaded 2 variable AND gate stage, AND GATE 42; output 47 is coupled to AND gate 42 and particularly to the drains of MOS transistors 50 and 51. A logic signal C is fed to the gates of MOS transistors 50 and 52 and a logic signal $\overline{C}$ (the complement of C) is fed to the gates of MOS transistors 51 and 53 in AND gate 42. The sources of MOS transistors 52 and 53 are coupled to the ground reference. The output 54 is coupled to the drains of MOS transistor 52 and 53 and the sources of MOS transistors 50 and 51. Additional stages of AND gates identical to AND gate 40 or AND gate 42 are cascaded in a similar manner to perform the logical AND function for additional logic signals.

Referring now to FIG. 3B, the simplified AND gate 60 and AND gate 62 are cascaded for handling the three logic signals A, B and C and in this embodiment it is unnecessary to provide the complement of these logic signals in order to perform an AND gate logic function. The A logic signal is fed to the drain of MOS transistor 63 in AND gate 60 and the B logic signal is fed to the gates of MOS transistors 63 and 64. The source of MOS transistor 64 is coupled to the ground reference. The output 65 of AND gate 60 is fed to the next stage which comprises AND gate 62 and in particular to the drain of MOS transistor 66. A logic signal C is fed to the gates of MOS transistors 66 and 67. The logic output 68 is coupled to the drain of MOS transistor 67 and the source of MOS transistor 66. For each additional logic signal, an additional AND gate stage may be coupled in a cascaded manner to the output of the previous AND gate stage such as AND gate 62.

Referring now to FIGS. 4A and 4B an embodiment of the invention is shown wherein a replication of the basic 2 variable OR circuit is employed in a cascaded manner to perform higher order logic functions. A three variable OR function is accomplished by the embodiment shown in FIG. 4A and also by the simplified embodiment shown in FIG. 4B. The logic circuit shown in FIG. 4A performs a three variable OR gate function and comprises OR gate 70 and OR gate 72. Each OR gate 70 and 72 is equivalent to the 2 variable OR gate shown in FIG. 2A and the simplified OR gates 90 and 92 are each equivalent to the simplified OR gate shown in FIG. 2D. The cascaded OR gates 70 and 72 in FIG. 4A and the OR gates 90 and 92 in FIG. 4B perform the logic function according to the following truth table:

The circuit in FIG. 4A requires as inputs not only the three logic signals A, B and C but also the complements $\overline{B}$ and $\overline{C}$. Logic signal A is fed to the drains of MOS transistors 75 and 76 of OR gate 70, logic signal B is fed to the gates of MOS transistors 73 and 75 and $\overline{B}$ is fed to the gates of MOS transistors 74 and 76. The drains of MOS transistors 73 and 74 are connected to a $V_{DD}$ reference and the output 77 of OR gate 70 is coupled to the sources of MOS transistors 73 and 74 and the drains of MOS transistors 75 and 76. Output 77 is fed to OR gate 72 and in particular to the sources of MOS transistors 82 and 83. In addition, logic signal C is fed to the gates of MOS transistors 80 and 82 and the comolement of logic signal C, $\overline{C}$ is fed to the gates of MOS transistors 81 and 83. An output 84 of the 2-stage OR gate of FIG. 4A is coupled to the sources of MOS transistors 80 and 81 and the drains of MOS transistors 82 and 83. Additional stages of OR gates identical to OR gate 70 and OR gate 72 are cascaded in a similar manner to perform the logical OR function for additional logic signals.

Referring now to FIG. 4B, the simplified OR gate 90 and OR gate 92 are cascaded for handling the three logic signals A, B and C and in this embodiment it is unnecessary to provide the complement of these logic signals in order to perform an OR gate logic function. The A logic signal is fed to the drain of MOS transistor 94 in OR gate 90 and the B logic signal is fed to the gates of MOS transistors 93 and 94. The drain of MOS transistor 93 is coupled to a $V_{DD}$ reference. The output 95 of OR gate 90 is fed to the next stage which comprises OR gate 92 and the logic signal C is fed to the gates of MOS transistors 96 and 97. The output 98 of OR gate 92 is coupled to the source of MOS transistor 96 and the drain of MOS transistor 97. Therefore, it can be readily seen that for each additional logic signal, an additional OR gate stage may be added in a cascaded manner to the output of the previous OR gate stage such as OR gate 92.

Figure 6:
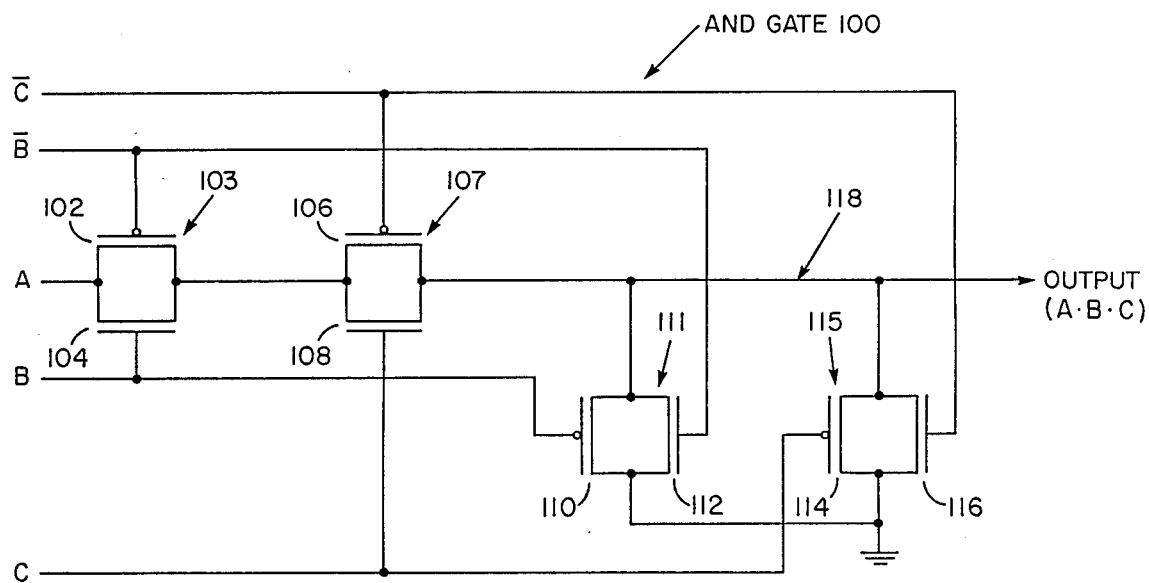
FIG. 6 is a circuit diagram showing an alternate embodiment of the invention for performing a logical AND function on three input signals.

Referring now to FIG. 6 there is shown an alternate embodiment of the invention for a 3-input (A,B,C) AND gate 100 logic circuit implemented with CMOS transmission gates 103, 107, 111 and 115, each of which comprises a pair of P-channel and N-channel MOS transistors having their gates fed by complementary logic signals. For example, transmission gate (T-gate) 103 comprises P-channel MOS transistor 102 and N-channel MOS transistor 104 and the gate of transistor 102 is fed by a $\overline{B}$ logic signal whereas the gate of transistor 104 is fed by a B logic signal. The other transmission gates 107, 111, 115 are similarly configured. An A logic signal is fed to an input of T-gate 103 and an output of T-gate 103 is coupled to an input of T-gate 107. The control gates of T-gate 107 are fed by logic signals C and $\overline{C}$ and the output of T-gate 107 is coupled to the output 118 of the AND gate 100. For each of the B and C input logic signals, T-gates 111 and 115 are connected in parallel between output 118 and a fixed reference potential which is ground for said AND gate 100. The B and $\overline{B}$ logic signals are fed to the control gates of T-gate 111 and the C and $\overline{C}$ logic signals are fed to the control gates of T-gate 115 shown in FIG. 6. AND gate 100 may be expanded to handle additional logic signal inputs by simply inserting for each additional input signal a T-gate in series with T-gate 107 and output 118 and another T-gate in parallel with T-gate 115 and coupled between output 118 and the ground reference potential. Simplifications of T-gates may be performed in AND gate 100 as was similarly done for a two-input AND as shown in FIGS. 1A to 1D depending on integrated circuit layouts and the particular circuit characteristics desired for an application.

Figure 7:
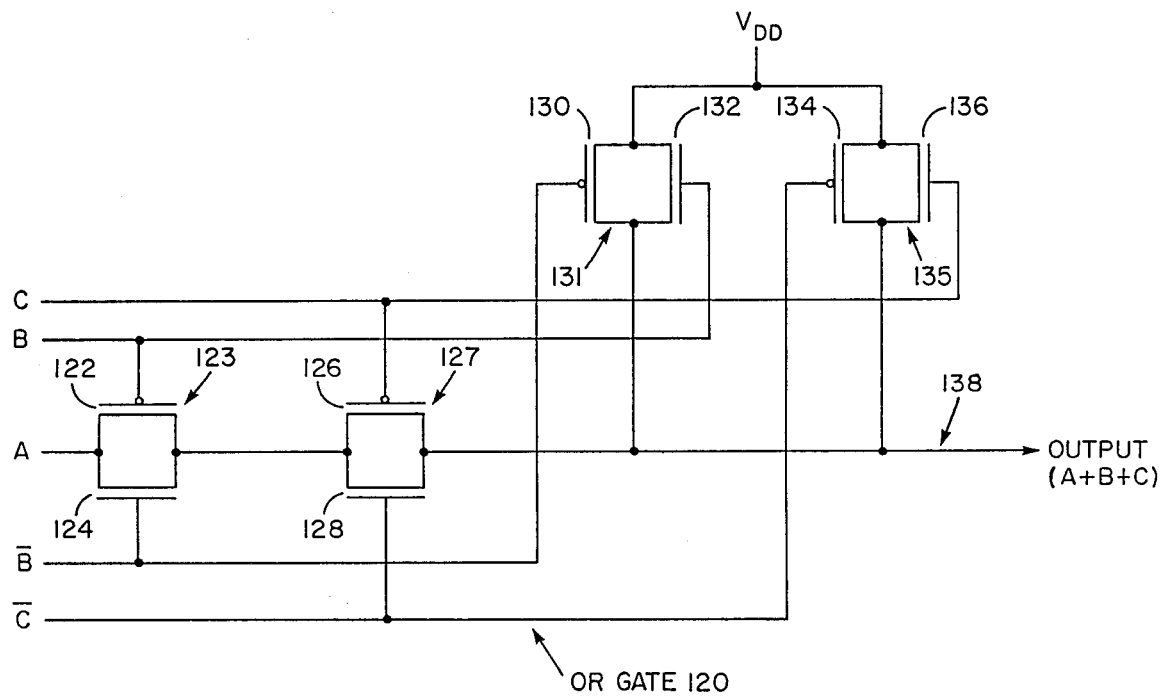
FIG. 7 is a circuit diagram showing an alternate embodiment of the invention for performing a logical OR function on three input signals.

Referring now to FIG. 7, there is shown an alternate embodiment of the invention for a 3-input (A,B,C) OR gate 120 logic circuit implemented with CMOS transmission gates (T-gates) 123, 127, 131 and 135 each of which comprises a pair of P-channel and N-channel MOS transistors having their gates fed by complementary logic signals. For example, transmission gate 123 comprises P-channel MOS transistor 122 and N-channel MOS transistor 126 and the control gate of transistor 122 is fed by a B logic sicnal whereas the gate of transistor 124 is fed by a $\overline{B}$ logic signal. The other transmission gates 127, 131 and 135 are similarly configured. An A logic signal is fed to an input of T-gate 123 and an output of T-gate 123 is coupled to an input of T-gate 127. The control gates of T-gate 127 are fed by logic signals C and $\overline{C}$ and the output of T-gate 127 is coupled to the output 138 of the OR gate 120. For each of the B and C input locic signals, T-gates 131 and 135 are connected in parallel between output 138 and a fixed reference potential which is $V_{DD}$ in said OR gate 120. The B and $\overline{B}$ logic signals are fed to the control gates of T-gate 131 and the C and $\overline{C}$ logic signals are fed to the control gates of T-gate 135 as shown in FIG. 7. OR gate 120 may be expanded to handle additional logic signal inputs by simply inserting for each additional input signal a T-gate in series with T-gate 127 and output 138 and another T-gate in parallel with T-gate 135 and coupled between output 138 and the $V_{DD}$ reference potential. Simplification of the T-gates may be performed in OR gate 120 as was similarly done for a two-input OR gate as shown in FIGS. 2A to 2D depending on integrated circuit layouts and the particular circuit characteristics desired for an application.

This concludes the description of the preferred embodiments. However, many modifications and alterations will be obvious to one of ordinary skill in the art without departing from the spirit and scope of the inventive concept. For example, the AND gate embodiments of the invention shown in FIG. 1B and FIG. 1C may be cascaded in a similar manner as the AND gate of FIG. 1D is shown cascaded in FIG. 3B; and likewise, the OR gate embodiments of the invention shown in FIG. 2B and FIG. 2C may be cascaded in a similar manner as the OR gate of FIG. 2D is shown cascaded in FIG. 4B. Therefore, it is intended that the scope of this invention be limited only by the appended claims.

What is claimed is:

1. A logic circuit for converting a plurality of input logic signals into an output logic signal representative of a predetermined logical combination of the plurality of input logic signals comprising:
   a plurality of electronic switch means, each of said switch means having an input terminal, an output terminal, a first control terminal and a second control terminal for coupling or decoupling the input terminal and the output terminal selectively in accordance with a logic state of a signal fed to the first and second control terminals;
   a first one of said plurality of input logic signals being fed to an input terminal of a first one of said switch means;
   a second one of said plurality of input logic signals being fed to the first control terminal of said first one of said switch means;
   a second one of said switch means having an input terminal coupled to the output terminal of said first one of said switch means;
   a third one of said plurality of input logic signals being fed to the first control terminal of said second one of said switch means;
   output terminals of a third one and a fourth one of said switch means coupled to the output terminal of said second one of said switch means and to an output of said logic circuit wherein: (i) said second one of said plurality of input logic signals being fed to the first control terminal of said third one of said switch means; (ii) said third one of said plurality of input logic signals being fed to the first control terminal of said fourth one of said switch means; and (iii) the input terminal of said third and fourth switch means being coupled to a signal having a predetermined reference potential representative of one of the logic states ofthe input logic signals;
   a fourth one of said plurality of input logic signals being fed to the second control terminal of said first switch means and the second control terminal of said third switch menas; and
   a fifth one of said plurality of input logic signals being fed to the second control terminal of said second switch means and the second control terminal of said fourth switch means.

2. The circuit recited in claim 1 wherein:
   each of said electronic switch means comprises a CMOS transmission gate.

3. The circuit recited in claim 1 wherein:
   said logic circuit performs logic operations including an AND function.

4. The circuit recited in claim 1 wherein:
   said logic circuit performs logic operations including an OR function.

5. A logic circuit for converting a plurality of input logic signals into an output logic signal representative of a predetermined logical combination of the plurality of input logic signals comprising:
   a plurality of switch means, each of said switch means having an input terminal, an output terminal, and at least one control terminal for coupling or deoupling the input terminal and the output terminal selectively in accordance with a logic state of a signal fed to said control terminal;
   a first one of said plurality of input logic signals being fed to an input terminal of a first one of said switch means;
   a second one of said plurality of input logic signals being fed to a first control terminal of said first one of said switch means;
   a second one of said switch means having an input terminal coupled to the output terminal of said first one of said switch means;
   a third one of said plurality of input logic signals being fed to a first control terminal of said second one of said switch means;

wherein: (i) output terminals of a third one and a fourth one of said switch means being coupled to the output termianl of said second one of said switch menas and to an output of said logic circuit, and (ii) the input terminal of said third and fourth switch means being coupled to a signal having a predetermined reference potential representative of one of the logic states of the input logic signals;

a fourth one of said plurality of input logic signals being fed to a second control terminal of said first switch means and a control terminal of said third switch means; and a fifth one of said plurality of input logic signals being fed to a second control terminal of said second switch means and a control terminal of said fourth switch means.

6. The circuit recited in claim 5 wherein:
each of said switch means comprises a CMOS transmission-gate.

7. The circuit recited in claim 5 wherein:
said logic circuit performs logic operations including an AND function.

8. The circuit recited in claim 5 wherein:
said logic circuit performs logic operations including an OR function.

9. The method of converting with a logic circuit a plurality of input logic signals into an output logic signal representative of a predetermined logical combination of the plurality of input logic signals, comprising the steps of:

providing a plurality of switch means, each of said switch means having an input terminal, an output terminal and at least one control terminal for coupling or decoupling the input terminal and the output terminal selectively in accordance with a logic state of a signal fed to said control terminal;

coupling a first one of said plurality of input logic signals to an input terminal of a first one of said switch means;

coupling a second one of said plurality of input logic signals to a first control terminal of said first one of said switch means;

coupling an output terminal of said first one of said switch means to an input terminal of a second one of said switch means;

coupling a third one of said plurality of input logic signals to a first control terminal of said second one of said switch means;

coupling output terminals of a third one and a fourth one of said switch means to the output terminal of said second one of said switch means and to an output of said logic circuit;

coupling an input terminal of said third and fourth switch means to a signal having a predetermined reference potential representative of one of the logic states of the input logic signals;

coupling a fourth one of said plurality of input logic signals to a second control terminal of said first switch means and a control terminal of said third switch means; and coupling a fifth one of said plurality of input logic signals to a second control terminal of said second switch means and a control terminal of said fourth switch means.

* * * * *

UNITED STATES PATENT AND TRADEMARK OFFICE
CERTIFICATE OF CORRECTION

PATENT NO. : 4,710,649

DATED : December 1, 1987

INVENTOR(S) : Edward T. Lewis

It is certified that error appears in the above-identified patent and that said Letters Patent is hereby corrected as shown below:

Column 5, line 33 delete "soeed" and replace with --speed--

Column 8, line 23 delete "comolement" and replace with --complement--

Column 9, line 23 delete "sicnal" and replace with --signal--

Column 9, line 31 delete "locic" and replace with --logic--

Signed and Sealed this

Thirteenth Day of September, 1988

Attest:

DONALD J. QUIGG

*Attesting Officer*　　　*Commissioner of Patents and Trademarks*